US012803553B2

(12) United States Patent
Chen et al.

(10) Patent No.: US 12,803,553 B2
(45) **Date of Patent: *Nov. 17, 2026**

(54) CONTACTLESS BUTTON

(71) Applicant: DARWIN PRECISIONS CORPORATION, Hsinchu County (TW)

(72) Inventors: Wei Chen, Hsinchu County (TW); Ya Han Ko, Hsinchu County (TW); Chih-Ping Hsu, Hsinchu County (TW); Yan-Min Liou, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 57 days.

This patent is subject to a terminal disclaimer.

(21) Appl. No.: 19/014,295

(22) Filed: Jan. 9, 2025

(65) Prior Publication Data

US 2025/0226825 A1 Jul. 10, 2025

(30) Foreign Application Priority Data

Jan. 10, 2024 (TW) ................................ 113101083

(51) Int. Cl.

*H03K 17/78* (2006.01)
*H03K 17/94* (2006.01)
*H03K 17/945* (2006.01)

(52) U.S. Cl.

CPC ........... *H03K 17/78* (2013.01); *H03K 17/941* (2013.01); *H03K 17/945* (2013.01); *H03K 2017/9455* (2013.01)

(58) Field of Classification Search

CPC .... H03K 17/78; H03K 17/941; H03K 17/945; H03K 2017/9455

See application file for complete search history.

(56) References Cited

U.S. PATENT DOCUMENTS 11,928,882 B2 3/2024 Lai et al.
2014/0176501 A1* 6/2014 Liou .................... G06F 3/0421 345/175

(Continued)

FOREIGN PATENT DOCUMENTS

CN 202838279 U 3/2013
CN 212608859 U 2/2021

(Continued)

OTHER PUBLICATIONS

Machine translation of CN 114204928 A (Year: 2022).*
Machine translation of CN 202838279 U (Year: 2013).*

*Primary Examiner* — Seung C Sohn

(57) ABSTRACT

A contactless button includes a substrate, a frame body, a first light-emitting unit, an optical imaging assembly, and an optical switch assembly. The frame body is mounted on the substrate. The optical imaging assembly is arranged in the frame body and covers the first light-emitting unit in the frame body. The optical imaging assembly converts a first light beam provided by the first light-emitting unit into a suspended optical image projected from the opening. The optical switch assembly includes a second light-emitting unit and an optical triggering switch. The second light-emitting unit is located in the frame body and faces the opening, and the optical triggering switch is located next to the opening and faces the opening. The optical imaging assembly includes a pattern plate including a pattern part and a light-transmitting part, and the second light-emitting unit emits the second light beam towards the light-transmitting part.

8 Claims, 4 Drawing Sheets

(56) References Cited

U.S. PATENT DOCUMENTS

2020/0184246 A1* 6/2020 Fan .................... G06V 40/1318
2024/0345686 A1* 10/2024 Liu ........................ G02B 30/00

FOREIGN PATENT DOCUMENTS

CN 114204928 A * 3/2022 ........... H03K 17/941
TW M500761 U 5/2015
TW 202242936 A 11/2022

* cited by examiner

CONTACTLESS BUTTON

FIELD OF THE INVENTION

The present invention relates to a button, and in particular to a contactless button capable of generating an optical suspension pattern.

BACKGROUND OF THE INVENTION

Buttons may be mainly divided into two types, one is a push button that needs to be actually touched by a user, and the other is a contactless button that does not need to be actually touched by a user. A push button generates electrical signals by the user's pressure, which causes the internal components to energize each other. A contactless button generates a signal by using a light sensor to detect changes in the light in front of the button caused by the user's finger. Because the contactless buttons can be operated without the user touching the device, they have the advantage of being more hygienic.

Due to the lack of tactile feedback, some contactless buttons may display a suspended optical image in the sensing area in front so that the user can confirm whether the button has been successfully operated. In other words, users can predict the sensing area of the button by observing the position of the suspended optical image displayed on the button. To generate patterns of suspended optical images, it is often necessary to block or filter the light projected from inside the button. Therefore, with the different patterns of suspended optical images, the actual intensity of light projected by different buttons to the outside may be inconsistent, and such inconsistency may lead to sensing errors for different buttons.

SUMMARY OF THE INVENTION

The present invention provides a contactless button with good sensing accuracy.

In order to achieve the above advantages, the contactless button of the present invention includes a substrate, a frame body, a first light-emitting unit, an optical imaging assembly, and an optical switch assembly. The frame body is mounted on the substrate, and one side of the frame body far away from the substrate has an opening. The first light-emitting unit is accommodated in the frame body. The optical imaging assembly is arranged in the frame body, covers the first light-emitting unit, and is adapted to convert a first light beam provided by the first light-emitting unit into a suspended optical image projected from the opening. The optical switch assembly includes a second light-emitting unit and an optical triggering switch. The optical triggering switch is adapted to generate a control signal when sensing a second light beam generated by the second light-emitting unit. The second light-emitting unit is mounted on the substrate, located in the frame body, and faces the opening. The optical triggering switch is mounted on the frame body, located beside the opening, and faces the opening. The optical imaging assembly includes a pattern plate. The pattern plate includes a pattern part and a light-transmitting part. The light-transmitting part surrounds the pattern part. The second light-emitting unit emits the second light beam towards the light-transmitting part.

In one embodiment, the pattern plate further includes a light-shielding layer. The light-shielding layer has a light-transmitting opening, and the light-shielding layer covers the pattern part but does not cover the light-transmitting part.

In one embodiment, the contactless button further includes a retaining wall. The retaining wall is located between the substrate and the optical imaging assembly and is adapted to block the second light beam from exiting from the light-transmitting opening.

In one embodiment, the retaining wall forms a frame body, is connected with the substrate and divides the substrate into a first region and a second region. The second region surrounds the first region. The second light-emitting unit is mounted at the second region.

In one embodiment, the orthogonal projection of the retaining wall on the pattern plate is located at the edge of the pattern part.

In one embodiment, the frame body includes an arrangement groove. The arrangement groove is formed at one side of the opening. A notch of the arrangement groove is inclined to a direction towards the opening. The optical triggering switch is arranged in the arrangement groove. The contactless button further includes an optical diffusion unit mounted in the arrangement groove and located in the notch.

In one embodiment, the optical imaging assembly further includes a lens array connected to the pattern plate and arranged on one side of the pattern plate far away from the substrate. The first light beam passes through the pattern plate and the lens array to form the suspended optical image.

In one embodiment, the optical imaging assembly further includes a collimating unit arranged between the substrate and the pattern plate and adapted to convert the first light beam and the second light beam into collimated light beams.

In one embodiment, the second light-emitting unit is an infrared light-emitting unit and the optical triggering switch is an infrared light sensor.

As can be seen from the above description, according to the contactless button of the present invention, the second light-emitting unit is mounted on the substrate and emits towards the opening, and the optical triggering switch is mounted beside the opening to sense the second light beam reflected by the finger of the user, so that the contactless button has a good sensing success rate by preventing the optical path of the second light beam from being blocked by the finger of the user; moreover, the pattern part and the light-transmitting part surrounding the pattern part are arranged on the pattern plate used for generating the suspended optical image and the second beam used for generating the sensing signal is only emitted from the light-transmitting part, so that different contactless buttons have same sizes of the light-transmitting parts regardless of the change of the pattern part, and thus good sensing accuracy can be achieved by avoiding a situation that different contactless buttons have different sensing distances.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF PREFERRED EMBODIMENTS

Figure 1:
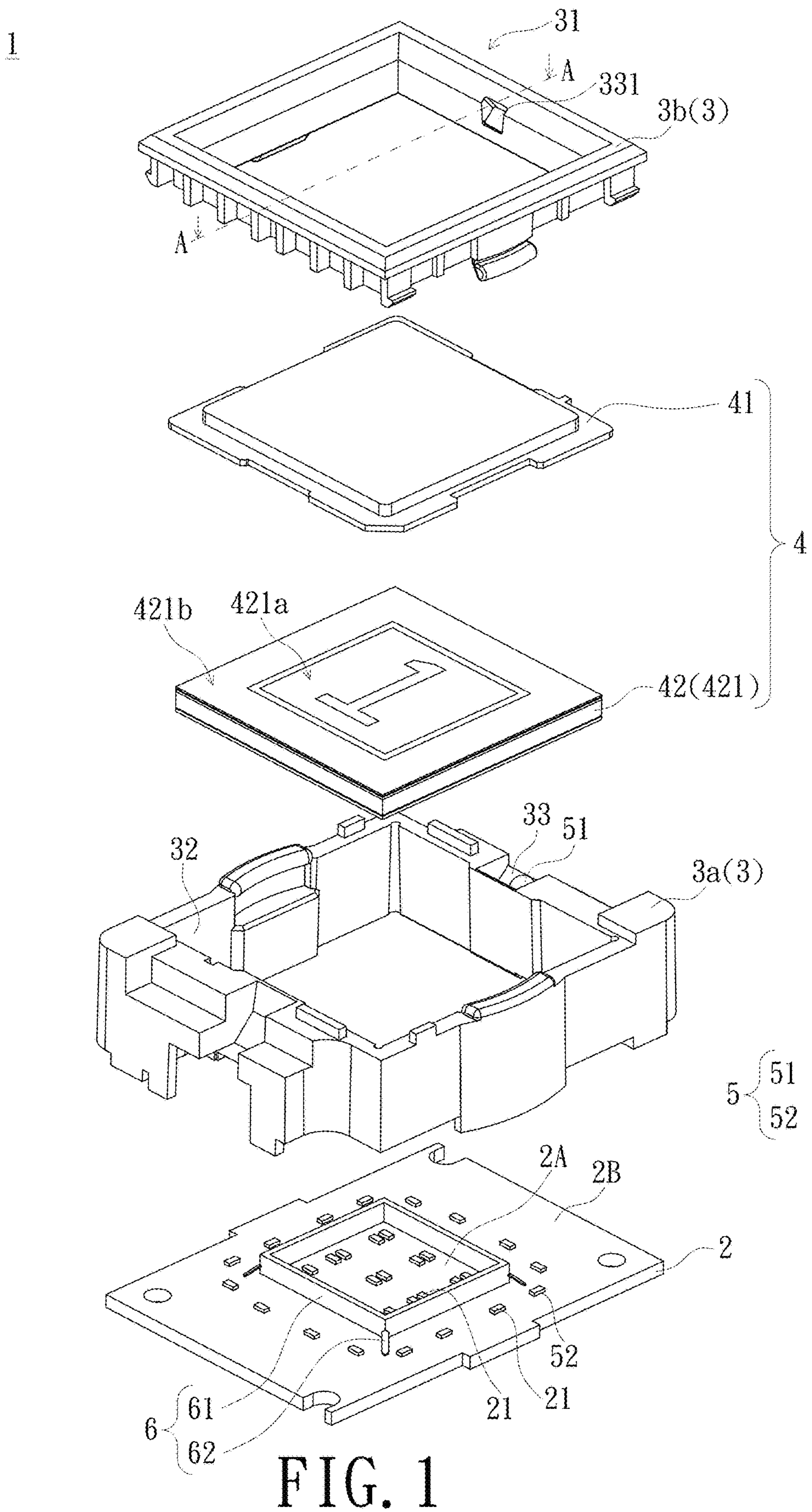
FIG. 1 is an exploded schematic view of a contactless button according to an embodiment of the present invention.

Terms used in the description of the embodiments of the present invention, for example, orientation or position relation such as "above" and "below" are described according to the orientation or position relation shown in the drawings. The above terms are used for facilitating description of the present invention rather than limiting the present invention, i.e., indicating or implying that the mentioned elements have to have specific orientations and to be configured in the specific orientations. In addition, terms such as "first" and "second" involved in the description or claims are merely used for naming the elements or distinguishing different embodiments or ranges rather than limiting the upper limit or lower limit of the quantity of the elements.

Figure 2:
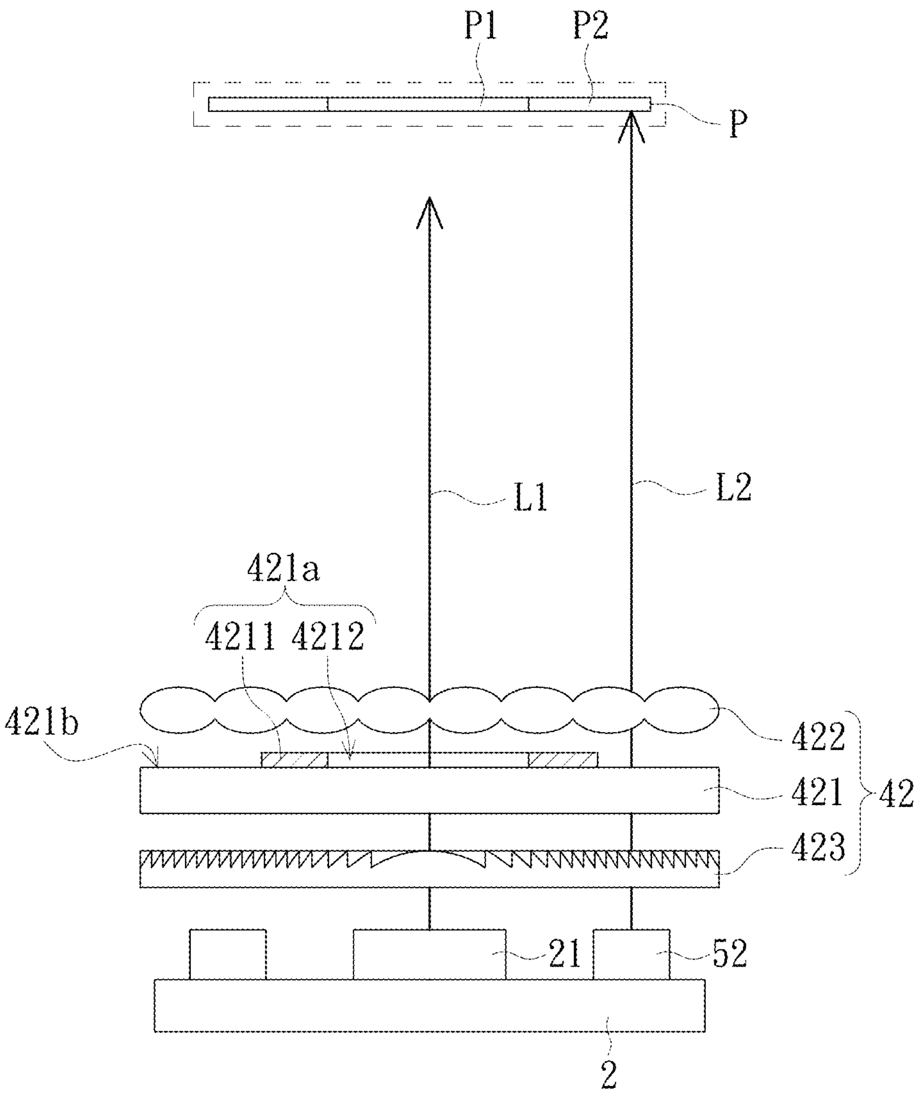
FIG. 2 is a schematic perspective view of an optical pressing plate assembly in FIG. 1.
Figure 3:
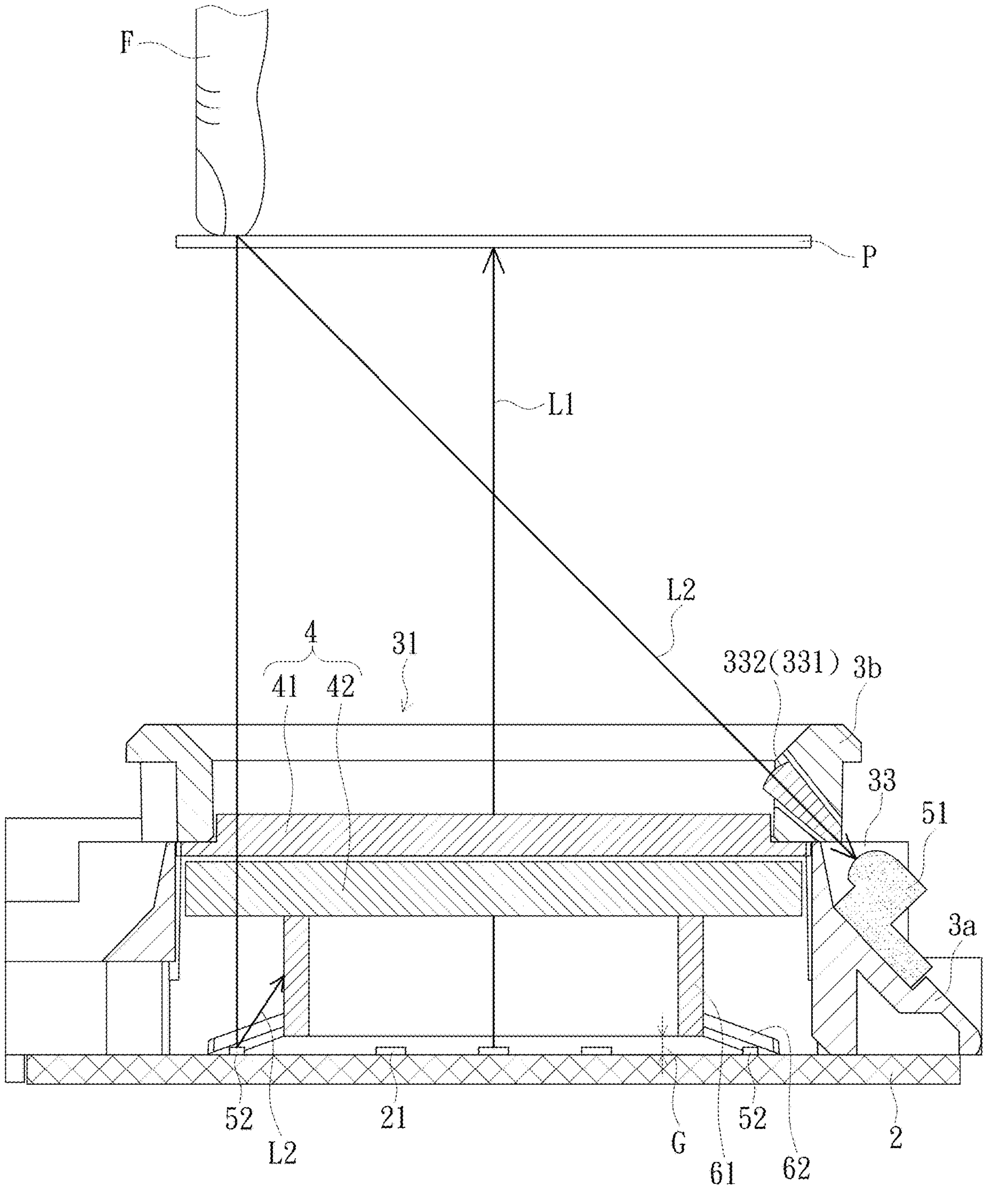
FIG. 3 is a schematic cross-sectional view of a portion in FIG. 1, taken along the line A-A in FIG. 1.
Figure 4:
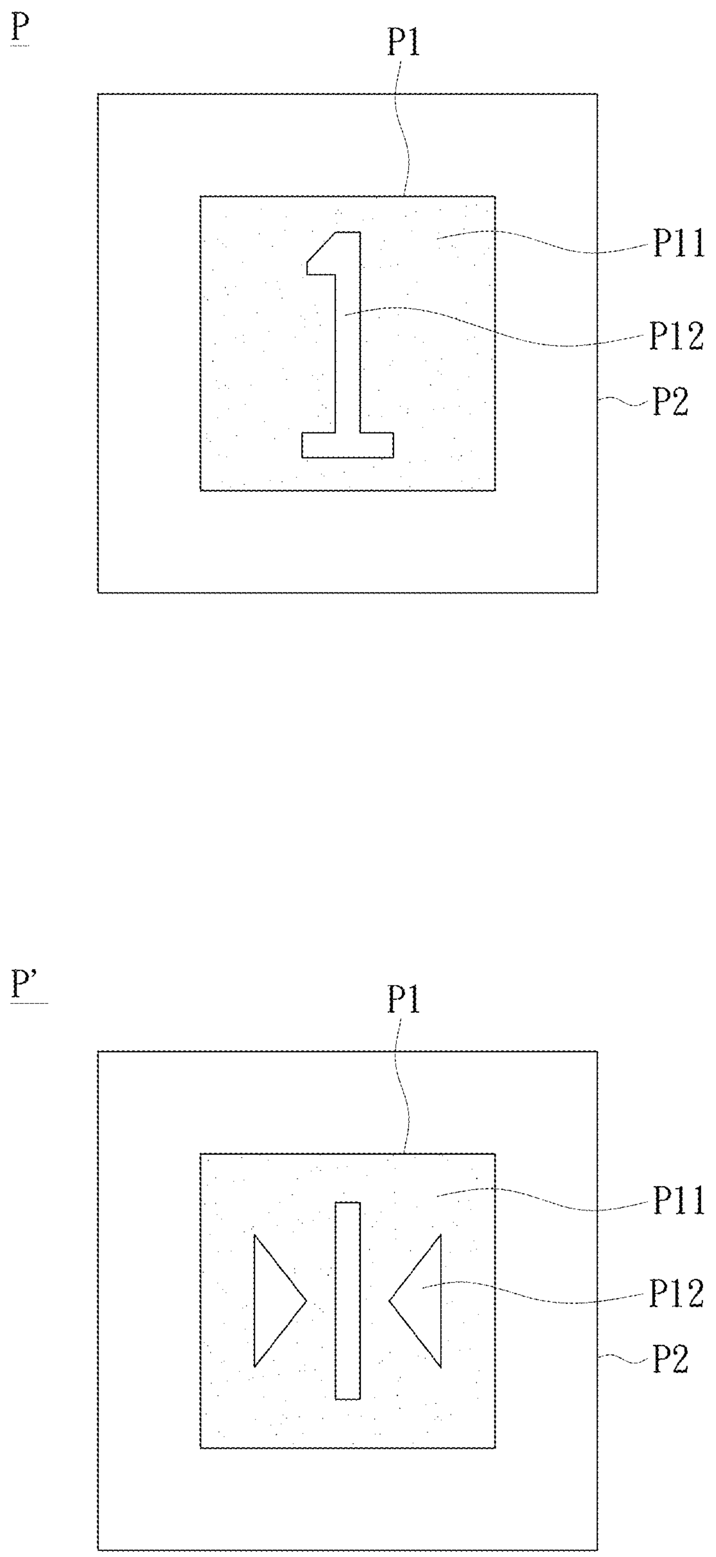
FIG. 4 is a schematic diagram showing different suspended optical images generated in the embodiment of FIG. 1.

FIG. 1 is an exploded schematic view of a contactless button according to an embodiment of the present invention. FIG. 2 is a schematic perspective view of an optical pressing plate assembly in FIG. 1. FIG. 3 is a schematic cross-sectional view of a portion in FIG. 1, taken along the line A-A in FIG. 1. FIG. 4 is a schematic diagram showing different suspended optical images generated in the embodiment of FIG. 1.

With reference to FIG. 1, the contactless button 1 of this embodiment includes a substrate 2, a frame body 3, a first light-emitting unit 21, an optical imaging assembly 4, and an optical switch assembly 5. The frame body 3 is mounted on the substrate 2, and one side of the frame body 3 far away from the substrate 2 has an opening 31. The first light-emitting unit 21 is accommodated in the frame body 3. The optical imaging assembly 4 is arranged in the frame body 3 and covers the first light-emitting unit 21, and the optical imaging assembly 4 is adapted to convert a first light beam L1 provided by the first light-emitting unit 21 into a suspended optical image P projected from the opening 31 (see FIG. 2). The optical switch assembly 5 includes a second light-emitting unit 52 and an optical triggering switch 51. The optical triggering switch 51 is adapted to generate a control signal when sensing a second light beam L2 generated by the second light-emitting unit 52. The second light-emitting unit 52 is mounted on the substrate 2, located in the frame body 3 and faces the opening 31 (see FIG. 3). The optical triggering switch 51 is mounted on the frame body 3, located beside the opening 31, and faces the opening 31. The optical imaging assembly 4 includes a pattern plate 421. The pattern plate 421 includes a pattern part 421*a* and a light-transmitting part 421*b*. The light-transmitting part 421*b* surrounds the pattern part 421*a*. The second light-emitting unit 52 emits the second light beam L2 towards the light-transmitting part 421*b* (see FIGS. 2 to 4).

Specifically, as shown in FIG. 1 and FIG. 3, in this embodiment, the shape of the frame body 3 is, for example, designed to correspond to an overall shape of the non-contact button 1 and to be square, but is not limited to this. The material of the frame body 3 is, for example, plastic. The frame body 3 includes, for example, a frame main body 3*a* and a front frame 3*b*. The frame main body 3*a* has an accommodating space 32 adapted to accommodate the first light-emitting unit 21, the second light-emitting unit 52, the optical imaging assembly 4, and other assemblies (not shown) on the substrate 2 after being connected to the substrate 2. When assembled, the frame main body 3*a* is fixed to the substrate 2, the front frame 3*b* is clamped on the frame main body 3*a*, the front frame 3*b* and the frame main body 3*a* together form an opening 31, and the optical imaging assembly 4 is sandwiched between the front frame 3*b* and the frame main body 3*a* (see FIG. 3).

As shown in FIG. 1 and FIG. 3, in this embodiment, the frame body 3 includes, for example, an arrangement groove 33. The arrangement groove 33 is formed at one side of the opening 31. The arrangement groove 33 extends obliquely from a notch 331 on the front frame 3*b* to the direction of the frame main body 3*a*, so that direction of the arrangement groove 33 and the notch 331 is inclined and towards the opening 31 (see FIG. 3). The optical triggering switch 51 is arranged in the arrangement groove 33 and electrically connected to the substrate 2.

As shown in FIG. 1, in this embodiment, the substrate 2 corresponds to the size of the frame body 3, for example. The substrate 2 is divided into a first region 2A and a second region 2B, for example. The first light-emitting units 21 are, for example, arranged in the first region 2A and the second region 2B, but not limited thereto. The second light-emitting units 52 are, for example, only arranged in the second region 2B. Please refer to the following explanation for the reasons for the arranging manner of the second light-emitting units 52.

As shown in FIG. 3, in this embodiment, the contactless button 1 further includes an optical diffusion unit 332, for example. The optical diffusion unit 332 is mounted in the arrangement groove 33 and clamped at the notch 331. One end of the optical diffusion unit 332 at the notch 331 has, for example, an arc convex surface. Thus, as shown in FIG. 3, the second light beam L2 reflected by the finger F of the user can enter the arrangement groove 33 in an appropriate direction under the guidance of the arc convex surface and emit towards the optical triggering switch 51. However, the present invention does not limit the specific structure of the optical diffusion unit 332.

With reference to FIG. 1 and FIG. 2, specifically, the optical imaging assembly 4 in this embodiment includes, for example, a cover plate 41 and an imaging assembly 42. The cover plate 41 is located on one side of the optical imaging assembly 4 far away from the substrate 2 and covers the entire imaging assembly 42. The cover plate 41 is adapted to protect the imaging assembly 42 and block the external dirt. The imaging assembly 42 further includes, for example, a lens array 422 and a collimating unit 423 in addition to the aforementioned pattern plate 421. The collimating unit 423 is located on one side of the imaging assembly 42 close to the substrate 2, and the pattern plate 421 is located between the lens array 422 and the collimating unit 423.

With reference to FIG. 2 and FIG. 4 together, specifically, the pattern plate 421 is, for example, a light-transmitting plate body, such as an acrylic sheet. The pattern plate 421 is provided with, for example, a light-shielding layer 4211 on its surface. The light-shielding layer 4211 has a light-transmitting opening 4212 (see FIG. 2). The light-shielding layer 4211 is adapted to form the pattern part 421*a*. In other words, the light-shielding layer 4211 covers the entire pattern part 421*a* and does not cover the light-transmitting part 421*b*, and the contour of the periphery of the light-shielding layer 4211 forms the contour of the pattern part 421*a*.

The shape of the light-transmitting opening 4212 corresponds, for example, to the shape of the pattern on a portion of the suspended optical image P. For example, in the suspended optical image P with the number 1 displayed (see FIG. 4), the shape of the light-transmitting opening 4212 on the pattern part 421*a* presents the number 1 (see FIG. 1). In the suspended optical image P' with a door-closing instruction (see FIG. 4), the shape of the light-transmitting opening 4212 presents the shape of the door-closing instruction (not shown). In other words, the pattern plates 421 with different light-transmitting openings 4212 can generate the suspended optical images P with different patterns.

The suspended optical images P only need to have patterns with recognizable contours. Therefore, in an embodiment not shown in the figure, the light-shielding layer 4211 on the pattern plate 421 can be changed into a light-transmitting filter layer, or a filter layer (its function will be described later) may be arranged on the light-transmitting opening 4212.

As shown in FIG. 2, the collimating unit 423 is arranged on one side of the imaging assembly 42 close to the substrate 2. The collimating unit 423 is arranged between the substrate 2 and the pattern plate 421. The collimating unit 423 is adapted to convert the first light beam L1 and the second light beam L2 directed in different directions from the first light-emitting unit 21 on the substrate 2 into collimated light beams roughly directed towards the opening 31. The collimating unit 423 is, for example, a Fresnel lens, but not limited thereto. The collimating unit 423 may be made by, for example, UV printing, injection molding, or hot flat pressing, and is not particularly limited.

As shown in FIG. 2, a lens array 422 is arranged on one side of the imaging assembly 42 far away from the substrate 2. The lens array 422, for example, is a double-sided convex lens array (see FIG. 2) or a single-sided convex lens array (not shown in the figure) composed of multiple small convex lenses. The lens array 422 is adapted to convert the first light beam L1 and the second light beam L2 passing through the pattern plate 421 into a suspended optical image P. When the lens array 422 is a single-sided convex lens array, the convex surfaces of the small convex lenses on the lens array 422 may face away from the pattern plate 421 or face the pattern plate 421. The lens array 422 may be made by UV printing, injection molding, or hot flat pressing, for example, and is not particularly limited.

As shown in FIG. 2 and FIG. 4, after the first light beam L1 generated by the first light-emitting unit 21 passed through the pattern plate 421 and the lens array 422, the first light beam L1 forms the suspended optical image P that is visually imaged in front of the contactless button 1 (in front of the opening 31). In this embodiment, the second light beam L2 generated by the second light-emitting unit 52 also passes through the optical imaging assembly 4, so that the second light beam L2 and the first light beam L1 together form the suspended optical image P. Please refer to the following explanation for the detailed composition of the suspended optical image P.

The size of the suspended optical image P generated through the lens array 422 is not limited, but is, for example, equal to or smaller than the size of the opening 31 to avoid overlapping of different suspended optical images P generated by the adjacent contactless buttons 1. The distance between the suspended optical image P and the lens array 422 can be changed as required.

The first light-emitting unit 21 and the second light-emitting unit 52 are, for example light-emitting diodes, but not limited to this. The first light beam L1 may be white, red, yellow, or other visible light beams. The second light beam L2 is, for example, an invisible infrared ray. The type of the optical triggering switch 51 corresponds to a wavelength of the second light beam L2 and is, for example, an infrared light sensor, and is adapted to sense the second light beam L2 reflected by the finger F of a user. As described above, the pattern plate 421 may have a light filter, and thus the color of the first light beam L1 is not limited to the color corresponding to the suspended optical image P.

As shown in FIG. 3, in this embodiment, the second light beam L2 exits through the optical imaging assembly 4, and the finger F of the user reflects the second light beam L2 to the optical triggering switch 51 in the arrangement groove 33 at a small angle less than 90 degrees. Thus, the finger F of the user can be prevented from blocking the optical path between the second light beam L2 and the optical triggering switch 51 (that is, the finger F can be prevented from generating a shadow that blocks the optical triggering switch 51).

As shown in FIG. 1 and FIG. 3, in order to avoid part of the second light beam L2 being emitted from the light-transmitting openings 4212 of the pattern part 421*a* such that the sensing distance of different contactless buttons 1 may vary due to the size of the light-transmitting openings 4212 of the pattern part 421*a*, the contactless button 1 in this embodiment further includes a retaining wall 6. The retaining wall 6 is adapted to block the second light beam L2 from exiting from the pattern part 421*a*.

As shown in FIG. 1 and FIG. 3, in this embodiment, the retaining wall 6 is composed of, for example, a square frame body (hereinafter referred to as a middle frame) that can be separated from the substrate 2. The middle frame has a frame-shaped surrounding wall 61 and elastic arms 62 distributed around the surrounding wall 61. During assembly, the middle frame is located between the optical imaging assembly 4 and the substrate 2, and the elastic arms 62 are in contact with the substrate 2, where there is a spacing G between the middle frame and the substrate 2. The elastic arms 62 can urge the optical imaging assembly 4 to press against the front frame 3*b*, but are not limited to this.

As shown in FIG. 3, the orthogonal projection of the frame body 3 (retaining wall 6) on the pattern plate 421 is, for example, located on the edge of the pattern part 421*a*. In other words, the shape and size of the surrounding wall 61 correspond to the contour of the pattern part 421*a*, for example, to prevent the user from directly observing the retaining wall 6 through the light-transmitting part 421*b*. From this point of view, in some embodiments, the surrounding wall 61 may be smaller than the contour of the pattern part 421*a* and may not correspond to the contour of the pattern part 421*a*.

In this embodiment, the first region 2A and the second region 2B on the substrate 2 are divided by, for example, the orthogonal projection of the frame body 3 on the substrate 2. The first region 2A corresponds to, for example, the position of the pattern part 421*a*, and the second region 2B corresponds to, for example, the position of the light-transmitting part 421*b* and surrounds the first region 2A. The first region 2A and the second region 2B are divided by the retaining wall 6; thus, in some embodiments, the area of the first region 2A may be less than that of the pattern part 421*a*, or the area of the second region 2B may be greater than that of the light-transmitting part 421*b*.

The second light-emitting units 52 are, for example, mounted in the second region 2B and not mounted in the first region 2A. The first light-emitting units 21 may be arranged in the first region 2A and the second region 2B. In other words, a part of the first light beam L1 may be emitted from the light-transmitting part 421*b*.

The retaining wall 6 serves as a component to prevent the second light beam L2 from exiting from the pattern part 421*a*. Thus, in other embodiments not shown, the retaining wall 6 may not be provided when the direction of the optical path of the second light beam L2 emitted by the second light-emitting unit 52 is relatively concentrated. Alternatively, in an embodiment where the number of the second light-emitting units 52 is relatively small, the retaining wall 6 may be a plate body located next to the second light-emitting units 52 to block the second light beam L2 from exiting towards the pattern part 421*a*. There is no limit to a specific arrangement manner of the retaining wall 6. In other embodiments, the retaining wall 6 may be made of a plate extending from the substrate 2 or a member arranged on one side of the optical imaging assembly 4 extending towards the substrate 2 (refer to the aforementioned spacing G). In addition, in an embodiment not shown in the figure, a light filter that only blocks the passage of the second light beam L2 but not the first light beam L1 can be arranged on the pattern part 421*a* (the light-transmitting opening 4212) to prevent the second light beam L2 from exiting from the pattern part 421*a*, and therefore the retaining wall 6 may not be provided.

With reference to FIG. 2 to FIG. 4, in this embodiment, both the first light beam L1 and the second light beam L2 pass through the optical imaging assembly 4 and together form the suspended optical image P, and the second light beam L2 is blocked by, for example, the retaining wall 6 and does not exit from a portion of the pattern part 421*a*. Therefore, in this embodiment, the suspended optical image P includes, for example, a portion (sensing dead angle) that cannot reflect a middle pattern P1 of the second light beam L2 and a portion (sensing region) that can reflect a peripheral pattern P2 of the second light beam L2. A portion of the middle pattern P1 includes, for example, a first portion P11 and a second portion P12, a shape of the first portion P11 corresponds to the shape of the light-transmitting opening 4212 (see FIG. 2) and the shape of the second portion P12 corresponds to the shape of the pattern part 421*a* (see FIG. 2). A shape of a peripheral pattern P2 corresponds to a shape of the light-transmitting part 421*b*, for example. Moreover, in other embodiments, for example, an emergent angle of a part of the second light beam L2 can be changed through the lens array 422 or by adding other optical components, so that a part of the second light beam L2 is refracted to the middle pattern P1 after passing through the pattern plate 421; in other words, the suspended optical image P in such embodiments does not have a sensing dead angle.

As can be seen from the above description, according to the contactless button of the present invention, the second light-emitting unit is mounted on the substrate and emits towards the opening, and the optical triggering switch is mounted beside the opening to sense the second light beam reflected by the finger of the user, so that the contactless button has a good sensing success rate by preventing the optical path of the second light beam from being blocked by the finger of the user; moreover, the pattern part and the light-transmitting part surrounding the pattern part are arranged on the pattern plate used for generating the suspended optical image and the second beam used for generating the sensing signal is only emitted from the light-transmitting part, so that different contactless buttons have same sizes of the light-transmitting parts regardless of the change of the pattern part, and thus good sensing accuracy can be achieved by avoiding a situation that different contactless buttons have different sensing distances.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A contactless button, comprising:

a substrate;

a frame body, mounted on the substrate, wherein one side of the frame body far away from the substrate has an opening;

a first light-emitting unit, accommodated in the frame body;

an optical imaging assembly, arranged in the frame body and covering the first light-emitting unit, wherein the optical imaging assembly is adapted to convert a first light beam provided by the first light-emitting unit into a suspended optical image projected from the opening; and an optical switch assembly, comprising a second light-emitting unit and an optical triggering switch, wherein the optical triggering switch is adapted to generate a control signal when sensing a second light beam generated by the second light-emitting unit, the second light-emitting unit is mounted on the substrate, located in the frame body and faces the opening, and the optical triggering switch is mounted on the frame body, located beside the opening and faces the opening;

wherein the optical imaging assembly comprises a pattern plate, the pattern plate comprises a pattern part and a light-transmitting part, the light-transmitting part surrounds the pattern part, and the second light-emitting unit emits the second light beam towards the light-transmitting part;

wherein the pattern plate further comprises a light-shielding layer, the light-shielding layer has a light-transmitting opening, the light-shielding layer covers the pattern part but does not cover the light-transmitting part, and a shape of the light-transmitting opening corresponds to a shape of a pattern on a portion of the suspended optical image.

2. The contactless button according to claim 1, further comprising a retaining wall, wherein the retaining wall is located between the substrate and the optical imaging assembly and is adapted to block the second light beam from exiting from the light-transmitting opening.

3. The contactless button according to claim 2, wherein the retaining wall forms a frame body, is connected with the substrate, and divides the substrate into a first region and a second region, the second region surrounds the first region, and the second light-emitting unit is mounted at the second region.

4. The contactless button according to claim 2, wherein an orthogonal projection of the retaining wall on the pattern plate is located at an edge of the pattern part.

5. The contactless button according to claim 1, wherein the frame body comprises an arrangement groove, the arrangement groove is formed at one side of the opening, a notch of the arrangement groove is inclined to a direction of the opening, the optical triggering switch is arranged in the arrangement groove, and the contactless button further comprises an optical diffusion unit mounted in the arrangement groove and located in the notch.

6. The contactless button according to claim 1, wherein the optical imaging assembly further comprises a lens array connected to the pattern plate and arranged on one side of the pattern plate far away from the substrate, and the first light beam passes through the pattern plate and the lens array to form the suspended optical image.

7. The contactless button according to claim 1, wherein the optical imaging assembly further comprises a collimating unit arranged between the substrate and the pattern plate and is adapted to convert the first light beam and the second light beam into a collimated light beam.

8. The contactless button according to claim 1, wherein the second light-emitting unit is an infrared light-emitting unit and the optical triggering switch is an infrared light sensor.

* * * * *